United States Patent
Hwang et al.

(10) Patent No.: US 12,341,047 B2
(45) Date of Patent: Jun. 24, 2025

(54) OVERLAY MEASUREMENT DEVICE AND METHOD, AND SYSTEM AND PROGRAM THEREFOR

(71) Applicant: AUROS TECHNOLOGY, INC., Hwaseong-si (KR)

(72) Inventors: Sol-Lee Hwang, Hwaseong-si (KR); Hee-Chul Lim, Hwaseong-si (KR); Dong-Won Jung, Hwaseong-si (KR); Min-Ho Lee, Hwaseong-si (KR); Hyun-Kyoo Shon, Hwaseong-si (KR)

(73) Assignee: AUROS TECHNOLOGY, INC., Hwaseong-si (KR)

( * ) Notice: Subject to any disclaimer, the term of this patent is extended or adjusted under 35 U.S.C. 154(b) by 0 days.

(21) Appl. No.: 18/433,498

(22) Filed: Feb. 6, 2024

(65) Prior Publication Data

US 2024/0178038 A1    May 30, 2024

Related U.S. Application Data

(63) Continuation of application No. 18/227,652, filed on Jul. 28, 2023, now Pat. No. 12,009,243.

(30) Foreign Application Priority Data

Oct. 17, 2022 (KR) .......................... 10-2022-0133289

(51) Int. Cl.
*H01L 21/68* (2006.01)
(52) U.S. Cl.
CPC .................. *H01L 21/681* (2013.01)
(58) Field of Classification Search
CPC ....................................................... H01L 21/681
(Continued)

(56) References Cited

U.S. PATENT DOCUMENTS 11,761,969 B2    9/2023  Milo et al.
2019/0004437 A1*  1/2019  Bhattacharyya .... G03F 7/70058

FOREIGN PATENT DOCUMENTS

JP    2010-199333 A    9/2010
JP    2015-534267 A    11/2015
(Continued)

OTHER PUBLICATIONS

Taiwanese Office Action for related TW Application No. 112124828 mailed Mar. 14, 2024 from Taiwanese Intellectual Property Office.
(Continued)

*Primary Examiner* — Mohamed K Amara
*Assistant Examiner* — Omar H Nixon
(74) *Attorney, Agent, or Firm* — Paratus Law Group, PLLC

(57) ABSTRACT

An overlay measurement device for measuring an error between a first overlay mark and a second overlay mark respectively formed on different layers of a wafer, includes: a light source; an objective lens that concentrates a beam from the light source on a measurement position of the wafer, and gathers the beam being reflected in the measurement positon; a lens focus actuator that adjusts a distance between the objective lens and the wafer such that a focus surface is placed at the first overlay mark or the second overlay mark; an auto focus module that adjusts a focus by adjusting the lens focus actuator; a detector for obtaining an image of the first overlay mark or an image of the second overlay mark; a transmission and receipt part; and a processor connecting to the transmission and receipt part electrically.

11 Claims, 7 Drawing Sheets

(58) Field of Classification Search
USPC ............................................. 700/67
See application file for complete search history.

(56) References Cited

FOREIGN PATENT DOCUMENTS

| | | | |
|---|---|---|---|
| JP | 2022-523692 A | 4/2022 |
| JP | 2022-542557 A | 10/2022 |
| KR | 10-1999-0074610 A | 10/1999 |
| KR | 10-2001-0058692 A | 7/2001 |
| KR | 10-2003-0016458 A | 3/2003 |
| KR | 10-2006-0043963 A | 5/2006 |
| KR | 10-2008-0036901 A | 4/2008 |
| KR | 10-2014-0053141 A | 5/2014 |
| KR | 10-2016-0138778 A | 12/2016 |
| KR | 10-2018-0033971 A | 4/2018 |
| KR | 10-2019-0142390 A | 12/2019 |
| KR | 10-2021-0031015 A | 3/2021 |
| TW | 202146885 A | 12/2021 |
| WO | WO 2020/055147 A1 | 3/2020 |

OTHER PUBLICATIONS

Japanese Office Action for related JP Application No. 2023-104269 mailed Jul. 9, 2024 from Japan Patent Office.
Korean Office Action for related KR Application No. 10-2022-0133289 mailed Dec. 7, 2022 from Korean Intellectual Property Office.
Korean Notice of Allowance for related KR Application No. 10-2022-0133289 mailed Feb. 22, 2023 from Korean Intellectual Property Office.
Korean Office Action for related KR Application No. 10-2023-0043547 mailed Jan. 22, 2025 from Korean Intellectual Property Office.

* cited by examiner

OVERLAY MEASUREMENT DEVICE AND METHOD, AND SYSTEM AND PROGRAM THEREFOR

CROSS-REFERENCE TO RELATED APPLICATION

This application is a Continuation Application of U.S. patent application Ser. No. 18/227,652 (filed on Jul. 28, 2023), which claims priority to Korean Patent Application No. 10-2022-0133289 (filed on Oct. 17, 2022), which is hereby incorporated by reference in its entirety.

BACKGROUND

The present disclosure relates to an overlay measurement device and method, and a system therefor.

With the advancement in technologies, the size of a semiconductor device measuring the characteristics of a wafer decreases, and the density of the integrated circuit of a measurement device increases. For an integrated circuit to be formed on a wafer, a desired circuit structure and desired elements need to be consecutively formed in a specific position, in a series of manufacturing processes. In the manufacturing processes, a patterned layer is consecutively formed on a wafer.

In the repetitive stack processes, an electrically activated pattern is generated in the integrated circuit. At this time, unless each structure is arranged within a range of errors that are allowable in the production process, the performance and reliability in manufactured circuits deteriorate, since electrically activated patterns interfere with one another. To measure and verify an arrangement error among the layers, managers input or set a recipe for measuring the characteristics of a wafer to a measurement device.

However, so far, managers need to input a recipe directly to a measurement device, causing restrictions on time and space.

Additionally, managers themselves repeat choosing and measuring options of a filter, an aperture, a focus, a pinhole and the like, and checking a value, to determine an optimal option. At this time, managers' technical skills, abilities and experiences can serve as variables, making it difficult to ensure efficiency in the measurement of the characteristics of a wafer, which is based on optimized options.

Against this backdrop, options of a recipe need to be optimized while the recipe is measured.

Further, a minimum amount of information for optimization needs to be transmitted to a measurement device, to enable the measurement device to perform optimization of options.

SUMMARY

The objective of the present disclosure is to provide an overlay measurement device and method, and a system therefor.

The objective of the present disclosure is to provide a manager program that is driven in a manager PC to allow a measurement device to perform optimization of measurement options, and transmits information on a recipe.

The objective of the present disclosure is to provide a measurement device and a method thereof that performs optimization of measurement options of a wafer, based on data that are received from a manager PC.

Aspects according to the present disclosure are not limited to the above ones, and other aspects and advantages that are not mentioned above can be clearly understood from the following description and can be more clearly understood from the embodiments set forth herein. Additionally, the aspects and advantages in the present disclosure can be realized via means and combinations thereof that are described in the appended claims.

An overlay measurement device, in one embodiment, may comprise a transmission and receipt part; and a processor connecting to the transmission and receipt part electrically, and the processor may obtain data transmitted from a user terminal through the transmission and receipt part, analyze a recipe included in the data, and perform optimization of measurement options of a wafer, based on the recipe, after the recipe is analyzed.

A computer-readable recording medium, in one embodiment, may store a program that comprises instructions for controlling an operation of an overlay measurement system, the program comprising instructions to generate data comprising information on a recipe that is input through a manager program, and unique information on an overlay measurement device; and instructions to transmit the generated data to an overlay measurement device corresponding to the unique information and to perform optimization of measurement options of a wafer, based on the recipe, in a case where the overlay measurement device completes an analysis of the recipe.

Additionally, an overlay measurement system, in one embodiment, may comprise a user terminal generating data that comprises information on a recipe that is input through a manager program, and unique information on an overlay measurement device, and transmitting the generated data to an overlay measurement device corresponding to the unique information; and the overlay measurement device analyzing a recipe included in the data that are received from the user terminal, and performing optimization of measurement options of a wafer, based on the recipe, after the recipe is analyzed.

Further, a method of an overlay measurement device, in one embodiment, may comprise receiving data from a user terminal; analyzing a recipe that is included in the data; and performing optimization of measurement options of a wafer, based on the recipe, after the recipe is analyzed.

Furthermore, a method of an overlay measurement system, in one embodiment, may comprise generating data that comprises information on a recipe that is input through a manager program, and unique information on an overlay measurement device, and transmitting the generated data to an overlay measurement device corresponding to the unique information by a user terminal; and analyzing a recipe included in the data that are received from the user terminal, and performing optimization of measurement options of a wafer, based on the recipe, after the recipe is analyzed, by the overlay measurement device.

According to the present disclosure, a user terminal may generate data that comprise information on a recipe which is input through a manager program, and unique information on an overlay measurement device, and transmit the generated data to an overlay measurement device corresponding to the unique information, enabling the manager to control the measurement device comfortably and remotely, and to generate a recipe without using the measurement device.

According to the present disclosure, a measurement device may analyze a recipe included in data that are received from a user terminal, and perform optimization of measurement options of a wafer, based on the recipe, after the recipe is analyzed, making it possible to measure the characteristics of a wafer efficiently, based on the optimized options.

According to the present disclosure, a user terminal may generate data comprising information indicating whether to perform optimization of measurement options of a wafer, enabling a measurement device to perform optimization of measurement options of a wafer automatically.

According to the present disclosure, a user terminal may generate data comprising unique information of a measurement device, making it possible to transmit the data respectively to a plurality of measurement devices.

According to the present disclosure, one or more filters in a measurement device may be measured once to calculate statistical values in relation to a plurality of parameters for each filter, a weighted value may be applied respectively to the calculated statistical values, and a filter where a total of the statistical values, to which the weighted value is applied respectively, is a minimum may be chosen in a filter optimization process.

According to the present disclosure, one or more apertures in a measurement device may be measured once to calculate statistical values in relation to a plurality of parameters for each aperture, a weighted value may be applied respectively to the calculated statistical values, and an aperture where a total of the statistical values, to which the weighted value is applied respectively, is a minimum may be chosen in an aperture optimization process.

According to the present disclosure, a focus scan may be performed on one site in a measurement device to determine a focus measurement area, a focus may be moved step by step in the determined measurement area on each site to calculate statistical values in relation to a plurality of parameters, a weighted value may be applied respectively to the calculated statistical values, and a focus where a total of the statistical values, to which the weighted value is applied respectively, is a minimum may be chosen in a focus optimization process.

According to the present disclosure, an aperture in a measurement device may be measured once in a first pinhole position and measured once in a second pinhole position that is at a predetermined distance from the first pinhole position, Tis 3 Sigma may be calculated in the first pinhole position and the second pinhole position, the Tis 3 Sigma may be modeled for each pinhole position in relation to the aperture, and a pinhole position where the Tis 3 Sigma is a minimum may be chosen in a pinhole optimization process.

According to the present disclosure, information on options chosen in each of the filter optimization process, the aperture optimization process, the focus optimization process and the pinhole optimization process may be stored, enabling constant automatic optimization based on data that do not relate to user experiences.

Specific effects are described along with the above-described effects in the section of detailed description.

BRIEF DESCRIPTION OF THE DRAWINGS

The accompanying drawings constitute a part of the specification, illustrate one or more embodiments in the disclosure, and together with the specification, explain the disclosure.

DETAILED DESCRIPTION

Figure 1:
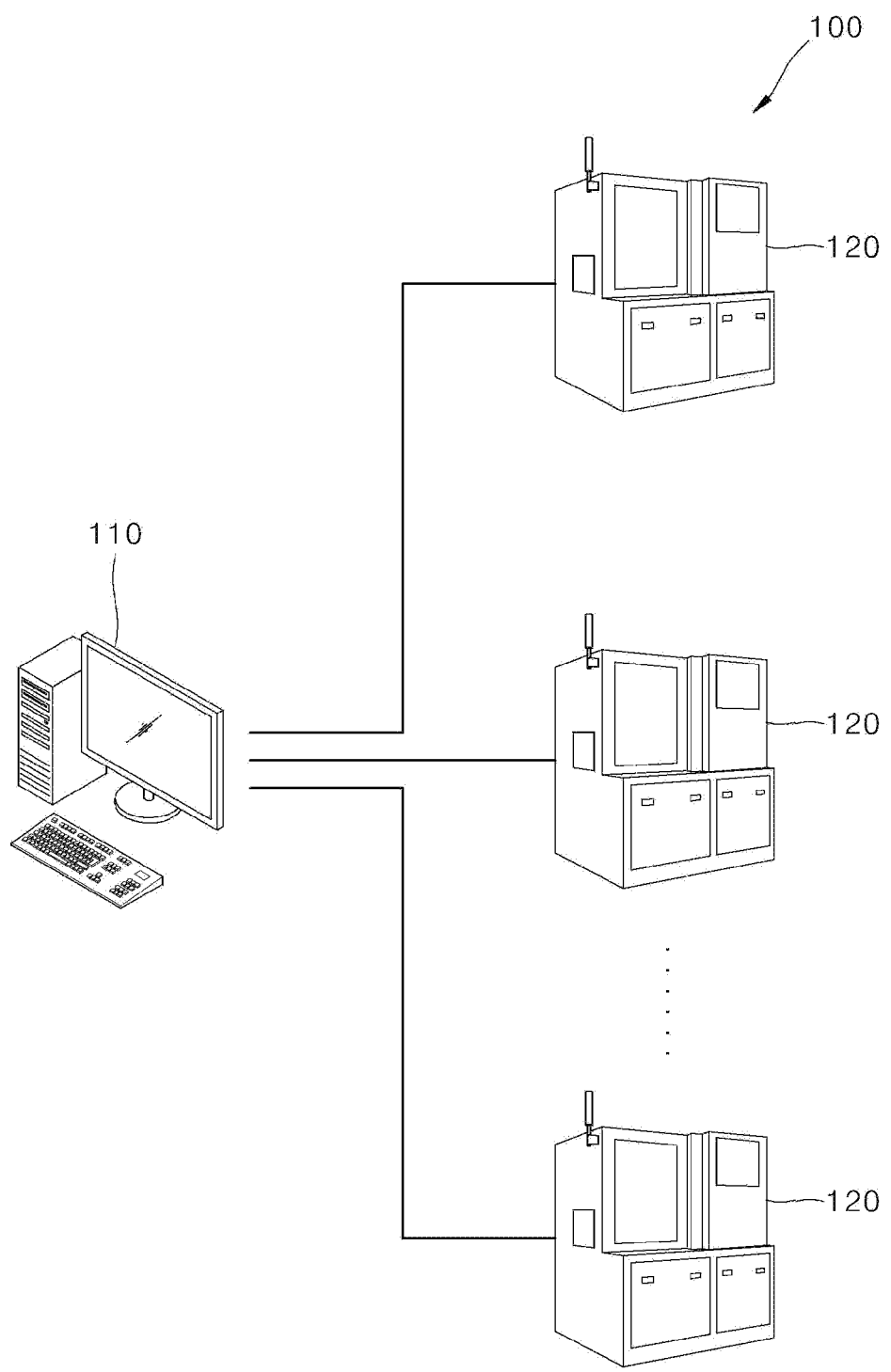
FIG. 1 is an exemplary view showing an overlay measurement system in one embodiment.

The above-described aspects, features and advantages are specifically described hereafter with reference to the accompanying drawings such that one having ordinary skill in the art to which the present disclosure pertains can embody the technical spirit of the disclosure easily. In the disclosure, detailed description of known technologies in relation to the subject matter of the disclosure is omitted if it is deemed to make the gist of the disclosure unnecessarily vague. Hereafter, preferred embodiments according to the disclosure are specifically described with reference to the accompanying drawings. In the drawings, identical reference numerals can denote identical or similar components.

The terms "first", "second" and the like are used herein only to distinguish one component from another component. Thus, the components should not be limited by the terms. Certainly, a first component can be a second component, unless stated to the contrary.

When one component is described as being "in the upper portion (or lower portion)" or "on (or under)" another component, one component can be directly on (or under) another component, and an additional component can be interposed between the two components.

When any one component is described as being "connected", "coupled", or "connected" to another component, any one component can be directly connected or coupled to another component, but an additional component can be "interposed" between the two components or the two components can be "connected", "coupled", or "connected" by an additional component.

Throughout the disclosure, each component can be provided as a single one or a plurality of ones, unless explicitly stated to the contrary.

The singular forms "a", "an" and "the" are intended to include the plural forms as well, unless explicitly indicated otherwise. It is to be further understood that the terms "comprise" or "include" and the like, set forth herein, are not interpreted as necessarily including all the stated components or steps but can be interpreted as excluding some of the stated components or steps or can be interpreted as including additional components or steps.

Throughout the disclosure, the terms "A and/or B" as used herein can denote A, B or A and B, and the terms "C to D" can denote C or greater and D or less, unless stated to the contrary.

Hereafter, described are an overlay measurement device and method, and a system therefor, in several embodiments.

FIG. 1 is an exemplary view showing an overlay measurement system in one embodiment.

Referring to FIG. 1, the overlay measurement system 100 in one embodiment may comprise a user terminal 110 (e.g. a computer, a laptop and the like) and at least one measurement device 120.

In one embodiment, the user terminal 110 may transmit data or signals to at least one measurement device 120 and receive data or signals from at least one measurement device 120 through a communication protocol (e.g., file transfer protocol (FTP)). For example, the user terminal 110 may transmit data or signals to one measurement device, or transmit data or signals to a plurality of measurement devices at the same time.

In one embodiment, the user terminal 110 may execute a manager program (e.g., auto recipe optimization (ARO)) to which information on at least one measurement device 120 is input by the user. The manager program may receive recipe information on the operation of the measurement device that measures the characteristics of a wafer from the user. For example, the manager program may receive a value in relation to a plurality of parameters for measuring the characteristics of a wafer from the user.

The manager program, as described above, is installed in the user terminal 110. Additionally, the user terminal 110 may synchronize with the measurement device 120 through the manager program to receive signals or data from the measurement device 120 and transmit signals or data from the measurement device 120 in real time.

A UI (a user interface) of the manager program (e.g., an ARO manager program) installed in the user terminal 110 may be similar to a UI installed in the measurement device. Additionally, the manager program may generate a recipe file as options to be set are checked and then stored in a recipe. In the case of recipe options, an initial value is set to a basic value at a time of generating a recipe, and if the user wants to change the initial value, the user can change the initial value. Further, the file generated in the user terminal 110 may be transmitted to the measurement device to measure a recipe, through FTP.

Further, for the recipe file to be transmitted to the measurement device, information on the PC IP, identifier, password, and server IP of the device need to be input to the manager program. As the information is input properly, the user terminal 110 may register an FTP path of files stored in the measurement device, to use the information to generate a recipe. The information are needed to use the manager program that is not input in the measurement device.

The files stored in the device may be files that contain a filter list, an aperture list, a template list used for a focus and a pinhole, and information on the version of each measurement device and the like which are used in the device.

Since the manager program may transmit a recipe to a plurality of measurement devices at the same time, a plurality of measurement devices may be additionally registered by repeating the above step. Each of the measurement devices needs to be registered at least once. Additionally, if necessary, an added measurement device may be removed and changed.

Further, a recipe may be generated in the state where the user knows information on a wafer already. However, the information on a wafer may be restructures, with a data file, at a corresponding tool. Accordingly, even if the user does not know the information on a wafer, a data file on results of measurement of the wafer may be loaded to generate a recipe.

In one embodiment, the user terminal 110 may generate data comprising information on an input recipe, and unique information on a measurement device 120 (e.g., the IP (Internet Protocol) address, identifier, and password of a measurement device, and the IP address of a server. For example, the user terminal 110 may generate data comprising information on a recipe for each measurement device, and unique information on each measurement device respectively.

In one embodiment, the user terminal 110 may generate data comprising information indicating whether to optimize measurement options of a wafer for each measurement device.

In one embodiment, the user terminal 110 may transmit the generated data to the measurement device corresponding to the unique information. For example, the user terminal 110 may transmit data or signals to one measurement device, or transmit data or signals to each of the plurality of measurement devices at the same time.

As describe above, the user terminal 110 may generate a plurality of data comprising unique information of each of the plurality of measurement devices, and transmit the plurality of generated data to a corresponding measurement device at the same time.

In one embodiment, the measurement device 120 may analyze a recipe included in data that are received from the user terminal 110, and after the recipe is analyzed, may perform optimization of measurement options of a wafer, based on the recipe.

For example, the manager program installed in the user terminal 110, and measurement software (e.g., an overlay application) installed in the measurement device 120 may transmit and receive data through FTP.

In one embodiment, the measurement software (e.g., an overlay application) installed in the measurement device 120 may operate in connection with the manager program installed in the user terminal 110, and comprise instructions that are to operate the measurement device, based on data (e.g., recipe information) received from the user terminal 110.

In one embodiment, the measurement device 120 may continue to check a path in which a recipe file is received from the user terminal 110 by using a thread, in the state where the measurement software is being executed.

In one embodiment, as a recipe file is received, the measurement device 120 may check whether the file is a recipe file by using at least one of the name form and the file extension of the recipe file.

For example, the name form may be 0000@0000@0000, and the extension may be xml.

In one embodiment, the measurement device 120 reads a recipe file line by line, to compose recipe information. As the composition of the recipe information is completed after the measurement device 120 reads the last line, the measurement device 120 may store the recipe.

In one embodiment, when failing to compose the recipe information, the measurement device 120 may transmit an error message indicating that the composition of the recipe fails, through a path in which the recipe file is transmitted, and may record and store the reason of the failure in a log file.

In one embodiment, the measurement device 120 may perform a filter optimization process, an aperture optimization process, a focus optimization process, a pinhole optimization process, and a chosen option storage process regardless of their order, in the case where the information indicating the execution of optimization of measurement options of a wafer is included in the data received after the composition of the recipe information is completed.

Additionally, the measurement device 120 may perform the filter optimization process, the aperture optimization process, the focus optimization process, the pinhole optimization process, and the chosen option storage process consecutively.

In one embodiment, the measurement device 120 may optimize measurement options of a recipe automatically, and this function is referred to as an auto recipe optimization (ARO) function. At this time, optimization options may typically comprise a filter, the number of apertures (NA), a focus and a pinhole, and may additionally comprise various options later.

Accordingly, for the recipe, optimal options may be automatically stored through the ARO, only with wafer information and measurement target position information.

With the help of the ARO function, various options may be automatically measured, chosen and optimized by using the program, leading to a reduction in the man-hours of a worker. Further, optimization speed closely related to the ability of a worker may decrease in a constant manner.

Figure 2:
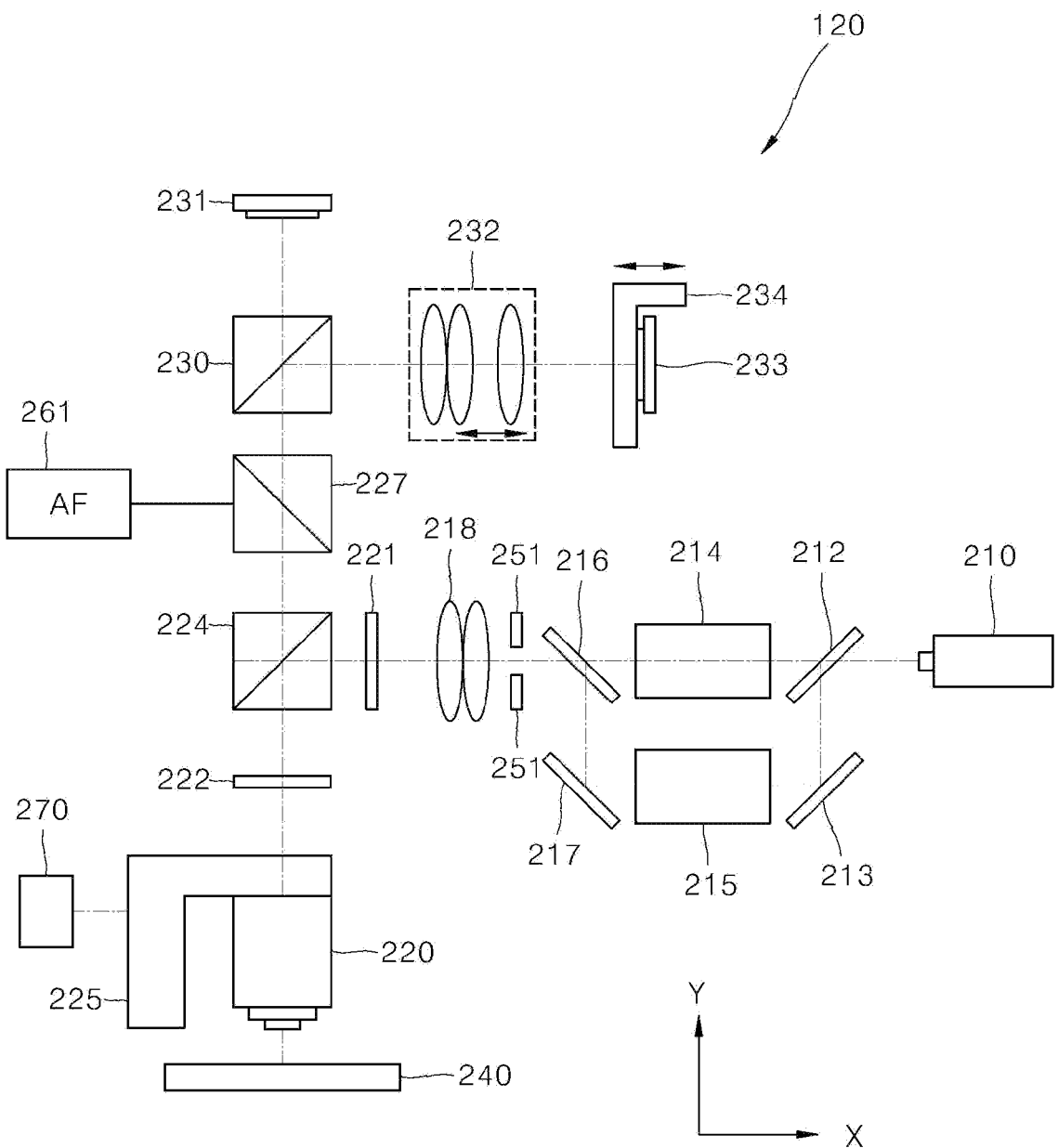
FIG. 2 is a conceptual view showing an overlay measurement device in one embodiment.

FIG. 2 is a conceptual view showing an overlay measurement device in one embodiment.

Referring to FIG. 2, the overlay measurement device 120 in one embodiment measures an error between a first overlay mark OM1 and a second overlay mark OM2 that are formed respectively in different layers formed in a wafer 240.

For example, the first overlay mark OM1 may be an overlay mark that is formed in a previous layer, and the second overlay mark OM2 may be an overlay mark that is formed in a current layer. The overlay marks are formed in a scribe lane while forming a layer for forming a semiconductor device, in a die area. For example, the first overlay mark OM1 may be formed together with an insulation layer pattern, and the second overlay mark OM2 may be formed together with a photoresist pattern that is formed on the insulation layer pattern.

At this time, the first overlay mark OM1 is covered by the photoresist layer, while the second overlay mark OM2 is exposed to the outside, and the first overlay mark OM1 is made of an oxide having optical properties that are different from those of the second overlay mark OM2 comprised of a photoresist material. Additionally, the focal surface of the first overlay mark OM1 and the focal surface of the second overlay mark OM2 may be identical with each other or different from each other.

The overlay measurement device 120 in one embodiment may comprise a light source 210, a first beam splitter 212, a first mirror 213, a first spectrum filter (a color filter) 214, a second spectrum filter 215, a beam combiner 216, a second mirror 217, a relay lens 218, a polarizing filter 221, an aperture 251, a second detector 233, a focus actuator 234, a zoom lens 232, a first detector 231, a second beam splitter 230, an optical element 227, a third beam splitter 224, a lambda wave plate 222, an objective lens 220, a lens focus actuator 225, an aperture 251, an auto focus (AF) 261, and a processor 270.

The configuration of the overlay measurement device 120 illustrated in FIG. 2 is provided as an example, and components of the overlay measurement device 120 are not limited to those of the embodiment illustrated in FIG. 2, and when necessary, some components may be added, changed or removed. For example, the overlay measurement device 120 may comprise a memory (not illustrated) in which instructions, programs, logics and the like for enabling a processor 270 to control the operation of each component of the overlay measurement device 120 are stored.

In one embodiment, the light source 210 may comprise a halogen lamp, a xenon lamp, a supercontinuum laser, a light-emitting diode, a laser induced lamp and the like.

In one embodiment, the first beam splitter 212 splits a beam generated from the light source 210 into two beams. The first beam splitter 212 transmits some of the beam generated from the light source 210, and reflects some of the beam generate from the light source 210, to split the beam generated from the light source 210 into two beams.

In one embodiment, the first mirror 213 is disposed between the first beam splitter 212 and the second spectrum filter 215, and changes the path of the beam reflected by the first beam splitter 212 toward the second spectrum filter 215.

In one embodiment, the first spectrum filter 214 adjusts the central wavelength and bandwidth of the beam having passed through the first beam splitter 212, out of the beams split by the first beam splitter 212, such that the central wavelength and bandwidth may be appropriate to obtain the image of the second overlay mark OM2 formed in the current layer. The spectrum filter may comprise one of a filter wheel, a linear translation device and a flipper device.

In one embodiment, the second spectrum filter 215 adjusts the central wavelength and bandwidth of the beam reflected by the first beam splitter 212, out of the beams split by the first beam splitter 212, such that the central wavelength and bandwidth may be appropriate to obtain the image of the first overlay mark OM1 formed in the previous layer. According to the present disclosure, the first spectrum filter and the second spectrum filter may be replaced with various types of filters. Additionally, the spectrum filter may comprise at least one of a filter wheel, a linear translation device and a flipper device.

In one embodiment, the beam combiner 216 combines the light having passed through the first spectrum filter 214 and the light having passed through the second spectrum filter 215. The light having passed through the first spectrum filter 214 passes through the beam combiner 216, and the beam having passed through the second spectrum filter 215 is reflected by the beam combiner 216 after its path is changed by the second mirror 217 toward the beam combiner 216, and is combined with the beam having passed through the beam combiner 216 again, and then passes through the aperture 251.

In one embodiment, the aperture 251 changes the beam having passed through the beam combiner such that the beam may be appropriate to photograph the first overlay mark 1.

In one embodiment, the second detector 233 detects the beam reflected by the second beam splitter 230. The second detector 233 is disposed at the focus actuator 234, to adjust a distance between the second beam splitter 230 and the second detector 233. The second detector 233 obtains the image of the first overlay mark OM1.

In one embodiment, the first detector 231 detects the beam having passed through the second beam splitter 230. The first detector 231 obtains the image of the second overlay mark OM2.

Alternatively, the second detector may not operate, and the first detector only may obtain the images of the first overlay mark OM1 and the second overlay mark OM2, depending user settings.

In one embodiment, the zoom lens 232 is disposed between the second beam splitter 230 and the focus actuator 234. The zoom lens 232 receives a position change value of the second detector 233 from the focus actuator 234, and based on the position change value, matches the magnification of the image of the second overlay mark OM2 and the magnification of the image of the first overlay mark OM1. Since an optical path distance between the second detector 233 and the second beam splitter 230 differs from an optical path distance between the first detector 231 and the second beam splitter 230 depending on a difference in the heights of the first overlay mark OM1 and the second overlay mark OM2, the magnification of the image obtained by the first detector 231 and the magnification of the image obtained by the second detector 233 may differ. To measure an overlay error accurately, the magnifications need to be matched.

In one embodiment, the second beam splitter 230 splits the beam gathered by the objective lens 220 into two beams. The second beam splitter 230 may comprise a tube beam splitter and a dichroic filter. The dichroic filter transmits a beam of a specific wavelength. The beam gathered at the objective lens 220 is split into two beams by the second beam splitter 230 through a lambda wave plate 222, a third beam splitter 224 and an optical element 227. That is, the beam gathered at the objective lens 220 splits into a beam appropriate to detect the first overlay mark OM1 and a beam appropriate to detect the second overlay mark OM2.

In one embodiment, the optical element 227 may comprise a hot mirror and a cold mirror.

In one embodiment, the third beam splitter 224 splits the beam combined through the beam combiner 216 into two beams again. The beam combined through the beam combiner 216 is split into two beams by the third beam splitter 224, through a relay lens 218 and a polarizing filter 221, in a polarized state.

In one embodiment, the objective lens 220 concentrates the beam, which is combiner by the combiner 216, is reflected by the third beam splitter 224 and then becomes one beam of polarized light through the lambda wave plate 222, on the measurement position of a wafer, and gathers a beam being reflected in the measurement position. The objective lens 220 is disposed at the lens focus actuator 225.

In one embodiment, the lens focus actuator 225 adjusts a distance between the objective lens 220 and a wafer 240 such that a focus surface may be placed at the first overlay mark OM1 or the second overlay mark OM2. The lens focus actuator 225 moves the objective lens 240 perpendicularly toward the wafer (e.g., in the Y direction), under the control of the processor 270, to adjust a focal length.

In one embodiment, the optical element is installed in a way that the optical element form an angle of 45° with respect to the path of the beam having passed through the beam splitter, to send a beam to an auto focus module, and is characterized by reflecting a long-wavelength beam, transmitting or reflecting a short-wavelength beam, and transmitting a long-wavelength beam. The optical element may be comprised of one of a hot mirror or a cold mirror.

In one embodiment, the auto focus module adjusts a focus, and generates a signal based on a distance between the objective lens and a wafer. That is, the auto focus module generates a signal based on a change in the position of a focus of the detector. The auto focus module may use an auto focus sensor module based on a phase difference. For example, in the case where a focus obtained by the auto focus sensor module is aligned with a 'standard focus', a phase difference value, which is a signal value output from the sensor, may be 0, and in the case where the focus is not aligned with the standard focus, the phase difference value may be a + value or a − value depending on the position of the focus. The 'standard focus' is the focus of the first or second detector, or the focus of the auto focus sensor, which is determined based on a signal of the sensor. The 'standard focus' may be aligned with a 'measurement focus' that is appropriate to obtain an actual alignment image, but in the case where there is a big difference in the heights of the first overlay mark OM1 and the second overlay mark OM2, the 'standard focus' usually differs from the 'measurement focus'.

The auto focus sensor obtains a signal based on the position of a focus by using a reflected light reflected from the measurement area of a wafer, and to adjust the position of the focus, the actuator adjusting a distance between the measure area of the wafer and the objective lens is adjusted.

Figure 3:
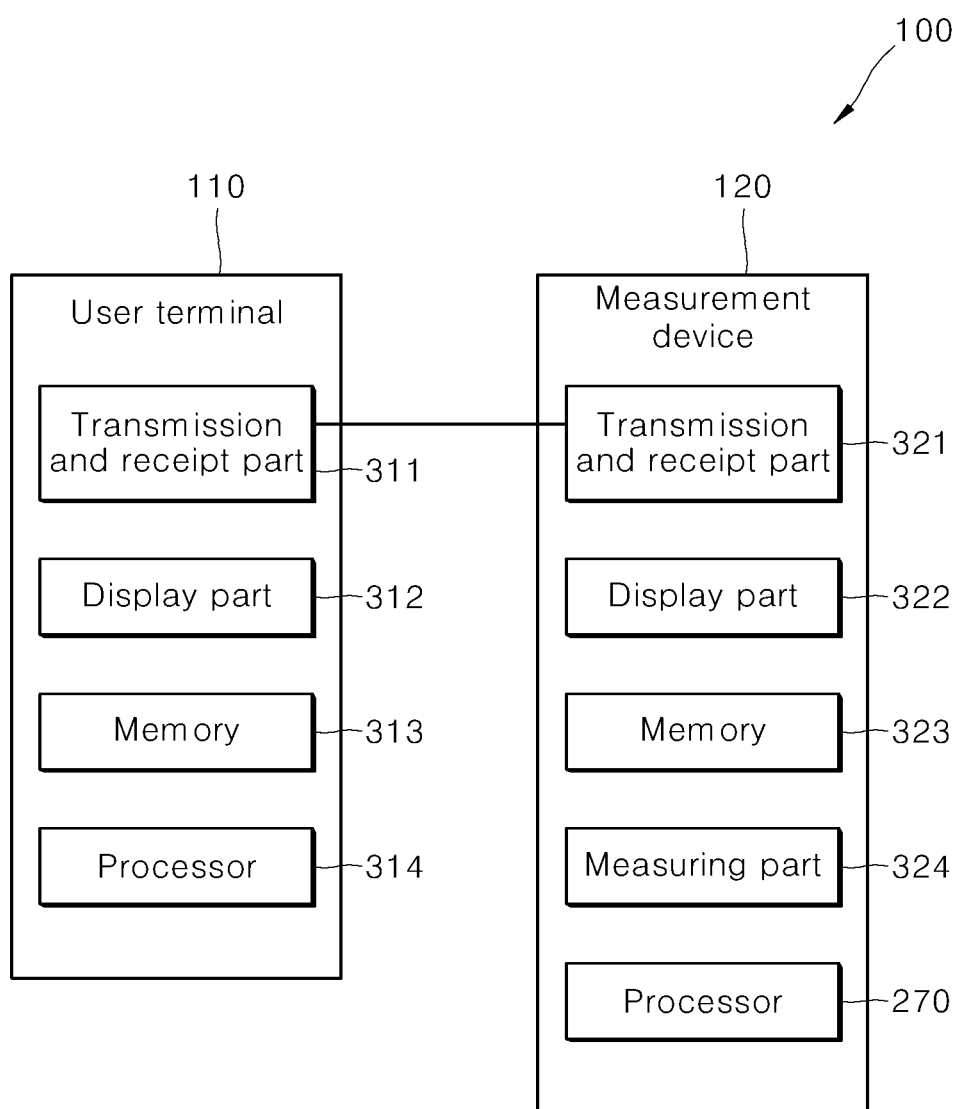
FIG. 3 is a block diagram showing the overlay measurement system in one embodiment.

FIG. 3 is a block diagram showing the overlay measurement system in one embodiment.

Referring to FIG. 3, the overlay measurement system 100 in one embodiment may comprise a user terminal 110 and a measurement device 120.

In one embodiment, the user terminal 110 may comprise a transmission and receipt part 311, a display part 312, a memory 313 and a processor 314.

For example, the transmission and receipt part 311 may transmit data or a signal to the measurement device 120 through a communication protocol (e.g., FTP).

For example, the display part 312 may display a manager program that receives a recipe setting value in relation to the measurement device from the user, under the control of the processor 314.

For example, the memory 313 may store an instruction or data in relation to at least one of other components of the user terminal 110. The memory 313 may store at least part of instructions, an algorithm, software and a program (e.g., an ARO manager program) that are required to transmit information on a recipe input from the user and unique information on the measurement device 120 to the measurement device 120.

For example, the memory 313 may store instructions that execute functions to allow the measurement device 120 to perform optimization through the manager program installed in the user terminal 110.

For example, the processor 314 may link with at least one measurement device 120 though the transmission and receipt part 311, to transmit data comprising recipe information on the measurement device to the measurement device 120.

For example, the processor 314 may execute the manager program (e.g., an ARO manager program) that receives a setting value in relation to the recipe of at least one measurement device 120, and display the manager program on the display 312. The manager program may receive recipe information on the operation of a measurement device measuring the characteristics of a wafer from the user or from the transmission and receipt part 311.

For example, the processor 314 may generate data comprising information on an input recipe, and unique information on a measurement device 120 (e.g., the IP address of a measurement device, the identifier of a measurement device, a password and the IP address of a server). For example, the processor 314 may generate data comprising information on a recipe for each measurement device, and unique information in relation to each measurement device, respectively.

For example, the processor 314 may generate data comprising information indicating whether to perform optimization of measurement options of a wafer for each measurement device.

For example, the processor 314 may transmit the generated data to a measurement device corresponding to the unique information. For example, the user terminal 110 may transmit data or signals to one measurement device, or transmit data or signals to each of the plurality of measurement devices at the same time.

Additionally, the processor 314 may generate data comprising information indicating whether to optimize measurement options of a wafer 240.

As described above, the processor 314 may generate a plurality of data comprising unique information of each of the plurality of measurement devices, and transmit the plurality of generated data to a corresponding measurement device at the same time.

In one embodiment, a measurement device 120 may comprise a transmission and receipt part 321, a display part 322, a memory 323, a measuring part 324 and a processor 270.

For example, the transmission and receipt part 321 may receive data or signals from the user terminal 110 through a communication protocol (e.g., FTP).

For example, the display part 322 may display information on a recipe received from the user terminal 110, through manager software (e.g., measurement software), under the control of the processor 270.

For example, the memory 323 may store an instruction or data in relation to at least one of other components of the measurement device 120. The memory 323 may store at least part of instructions, an algorithm and software that are required to receive information on a recipe and unique information on the measurement device 120 from the user terminal 110.

For example, the memory 323 may store a setting value in relation to the recipe received from the user terminal 110, a setting value preset in the measurement device 120, and data (e.g., optimized data in relation to options) generated based on the operation of the processor 270.

For example, the memory 323 may store instructions that execute functions to allow the measurement device 120 to perform optimization through software installed in the measurement device 120.

For example, the measuring part 324 may measure the characteristics of a wafer 240, based on the recipe information set in the measurement device 120, under the control of the processor 270.

For example, the processor 270 may receive data comprising the recipe information on the measurement device from the user terminal 110, through the user terminal 110 and the transmission and receipt part 321.

For example, the processor 270 may display software that receives the setting value on the recipe of the measurement device 120, on the display part 322. Additionally, the processor 270 may display the information of the recipe in relation to the measurement device, received from the user terminal 110, through measurement software.

In one embodiment, the processor 270 may analyze the recipe included in the data that are received from the user terminal 110. For example, the recipe may comprise a value in relation to a plurality of parameters for measuring the characteristics of the wafer 240.

Additionally, the recipe may comprise at least one of Final Residual 3 Sigma, Tis 3 Sigma, Registration 3 Sigma, total measurement uncertainty (TMU) indicating measurement precision, and move and measure (MAM) time indicating measurement time after movement between and measurement, or comprise total weight comprised of combinations thereof.

Additionally, data may comprise information indicating whether to optimize measurement options of the wafer 240.

In one embodiment, the processor 270 may determine whether a recipe file is verified, with at least one of the form of a recipe file name and a file extension included in the data that are received from the user terminal 110. For example, the form of the file name may be 0000@0000@0000, and the file extension may be xml.

For example, the processor 270 reads a recipe file line by line, to compose recipe information. As the composition of the recipe information is completed after the processor 270 reads the last line, the processor 270 may store the recipe in the memory 323.

In one embodiment, the processor 270 may measure one or more filters (e.g., spectrum filters) in the measurement device 120 once, to calculate statistical values in relation to a plurality of parameters for each filter. Alternatively, the processor 270 may measure one or more filters (e.g., spectrum filters) in the measurement device 120 at least once. A minimum number of the above-described measurement is one. The processor 270 may apply a weighted value respectively to the calculated statistical values, and perform a filter optimization process of choosing a filter where a total of the statistical values to which the weighted value is applied respectively is a minimum.

For example, the processor 270 may measure an overlay measurement value, i.e., Tis 3 Sigma and Registration 3 Sigma, in relation to each filter, and model the measured Tis 3 Sigma and Registration 3 Sigma to obtain Final Residual 3 Sigma.

Additionally, the processor 270 may obtain at least one of Final Residual 3 Sigma, Tis 3 Sigma, and Registration 3 Sigma, total measurement uncertainty (TMU) indicating measurement precision, and move and measure (MAM) time indicating measurement time after movement between measurement and measurement, or obtain total weight comprised of combinations thereof.

Additionally, the processor 270 may apply weigh respectively to the statistical value of at least one parameter of each filter, and choose a filter where a total of resultant values to which the weighted value is applied is a minimum.

In one embodiment, after the filter optimization process is performed, the processor 270 may measure one or more apertures in the measurement device 120 once to calculate statistical values in relation to a plurality of parameters for each aperture.

Additionally, after the filter optimization process is performed, the processor 270 may measure one or more apertures in the measurement device 120 once to calculate statistical values in relation to a plurality of parameters for each aperture. Further, the processor 270 may apply a weighted value respectively to the calculated statistical values, and perform an aperture optimization process of choosing an aperture (a numerical aperture (NA)) where a total of the statistical values to which the weighted value is applied respectively is a minimum. An aperture may use a single identical lens, and the number of the openings of the aperture may change, thereby making it possible to change the amount and shape of light.

For example, the processor 270 may measure an overlay measurement value, i.e., Tis 3 Sigma and Registration 3 Sigma, in relation to each aperture, and model the measured Tis 3 Sigma and Registration 3 Sigma to obtain final Residual 3 Sigma.

Further, the processor 270 may obtain at least one Final Residual 3 Sigma, Tis 3 Sigma, and Registration 3 Sigma, TMU and MAM time, or obtain total weight comprised of combinations thereof.

Further, the processor 270 may apply weigh respectively to the statistical value of each parameter of each aperture, and choose an aperture where a total of resultant values to which the weighted value is applied is a minimum.

In one embodiment, after the aperture optimization process is performed, the processor 270 may perform a focus scan on one site in the measurement device 120 to determine a focus measurement area, and move a focus step by step in the determined measurement area on each site to calculate statistical values in relation to the plurality of parameters. Additionally, the processor 270 may apply a weighted value respectively to the calculated statistical values, and perform a focus optimization process of choosing a focus where a total of the statistical values to which the weighted value is applied respectively is a minimum.

For example, the processor 270 may measure an overlay measurement value, i.e., Tis 3 Sigma and Registration 3 Sigma, in relation to each focus, and model the measured Tis 3 Sigma and Registration 3 Sigma to obtain final Residual 3 Sigma.

Further, the processor 270 may apply weigh respectively to the statistical value of each parameter of each focus, and choose a focus where a total of resultant values to which the weighted value is applied is a minimum.

In one embodiment, after the focus optimization process is performed, the processor 270 may measure an aperture once in the measurement device 120, in a first pinhole position, and measure the aperture once in a second pinhole position that is at a predetermined distance (e.g., 3 µm) from the first pinhole position. Further, the processor 270 may calculate Tis 3 Sigma in the first pinhole position and the second pinhole position, and model the Tis 3 Sigma for each pinhole position in relation to the aperture. Further, the processor 270 may perform a pinhole optimization process of choosing a pinhole position where the Tis 3 Sigma is a minimum.

In one embodiment, after the pinhole optimization process is performed, the processor 270 may store information (e.g., a resultant value of optimization) on options that are chosen in each of the above-described filter optimization process, aperture optimization process, focus optimization process and pinhole optimization process, in the memory 323.

Figure 4:
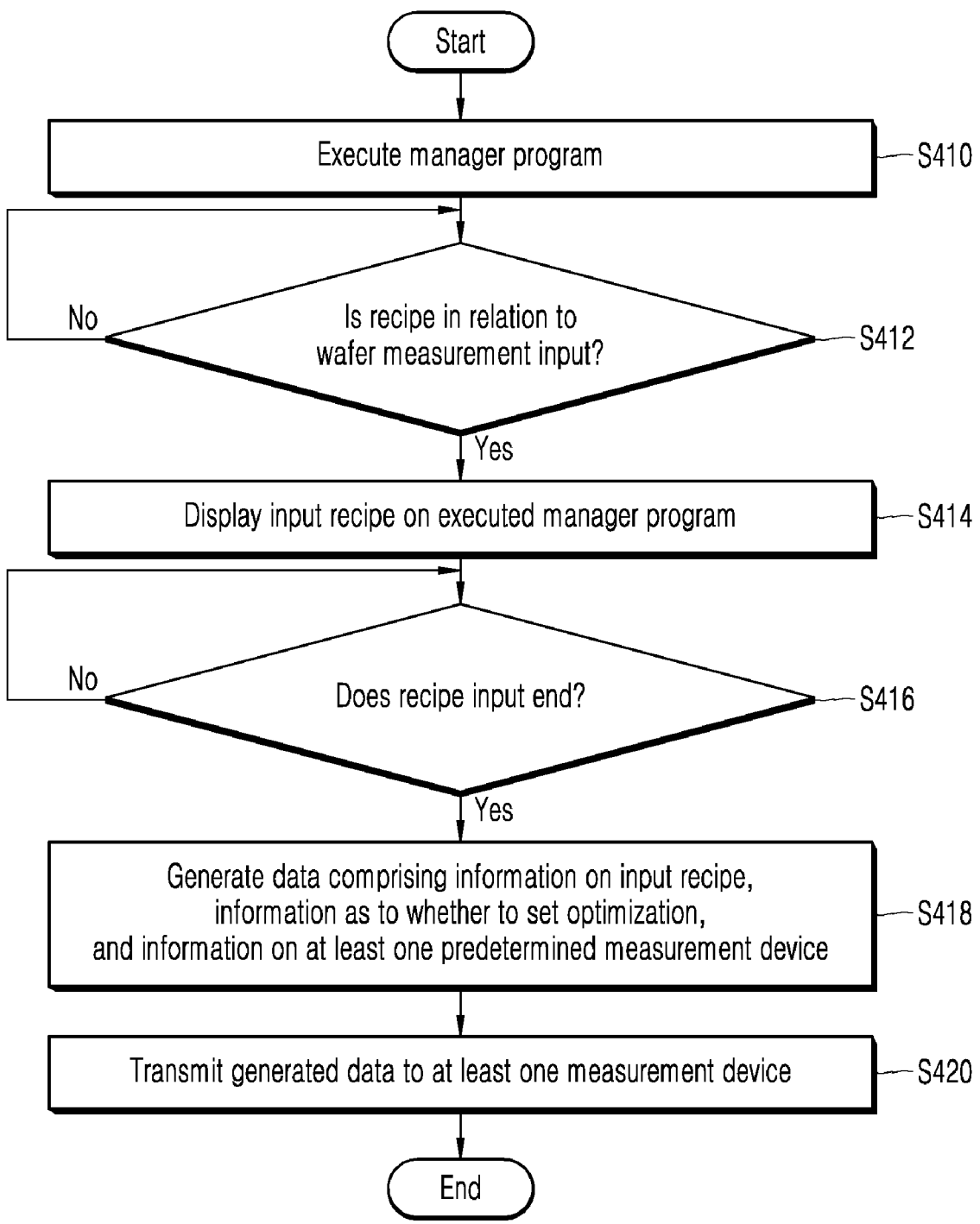
FIG. 4 is a flowchart showing a process in which a user terminal in one embodiment transmits data to the measurement device.
Figure 5:
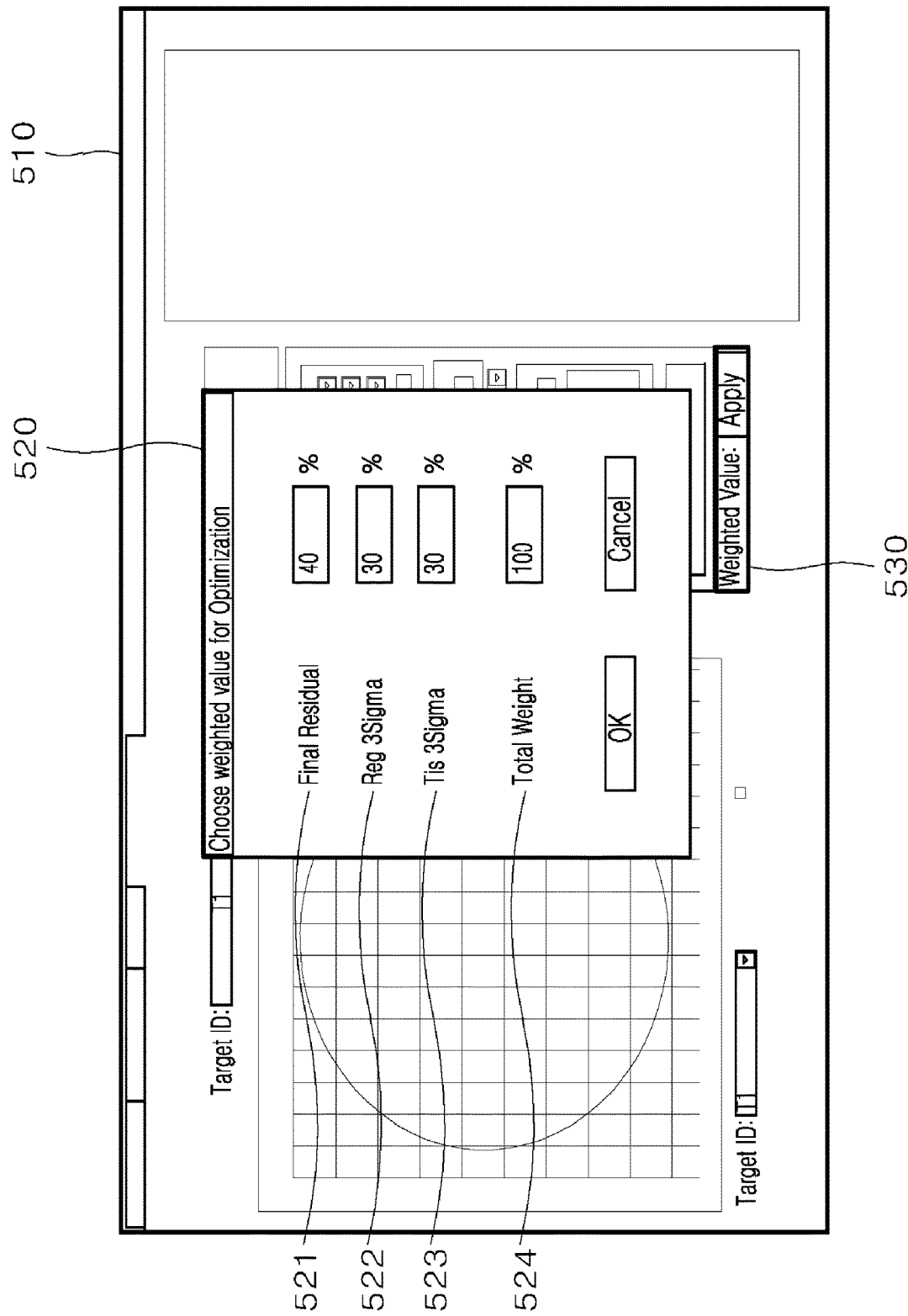
FIG. 5 is an exemplary view showing that information on a plurality of parameters is input to a manager program in one embodiment.

FIG. 4 is a flowchart showing a process in which a user terminal in one embodiment transmits data to the measurement device. FIG. 5 is an exemplary view showing that information on a plurality of parameters is input to a manager program in one embodiment.

Hereafter, the process in which the user terminal in one embodiment transmits data to the measurement device is described with reference to FIGS. 3 to 5.

In one embodiment, the processor 314 may execute a manager program (S410). The processor 314 may execute the manager program (e.g., an ARO manager program) that manages and controls the measurement device remotely and then display the manager program on the display part 312. The manager program may receive recipe information on the operation of the measurement device that measures the characteristics of a wafer, based on a user input, or obtain the recipe information from the transmission and receipt part 311.

In one embodiment, the processor 314 may identify whether a recipe in relation to wafer measurement is input (S412). The manager program may receive a value in relation to a plurality of parameters for measuring the characteristics of a wafer, based on an input of the user. For example, the plurality of parameters may comprise Final Residual 3 Sigma, Tis 3 Sigma and Registration 3 Sigma.

Additionally, the plurality of parameters may comprise total weight comprised of combinations at least one or more parameters.

Further, the manager program may receive may receive at least one of Final Residual 3 Sigma, Tis 3 Sigma, and Registration 3 Sigma, total measurement uncertainty (TMU) indicating measurement precision, and move and measure (MAM) time indicating measurement time after movement between measurement and measurement, or receive total weight comprised of combinations thereof.

In one embodiment, the processor 314 may display the input recipe on the executed manager program (S414). The processor 314 may display a value (e.g., a ratio) that is input from the user in relation to each of the plurality of parameters, in real time, on the manager program.

Referring to FIG. 5, the manager program (e.g., an ARO manager program) 510 may display a pop up 520 for receiving a value in relation to the plurality of parameters from the user. For example, a ratio of Final Residual 3 Sigma 521, a ratio of Tis 3 Sigma 521, and a ratio of Registration 3 Sigma 521 may be input to the pop up 520. Further, a ratio in relation to at least one or more of parameters may be input to the pop up 520.

For example, as the ratio of Final Residual 3 Sigma 521, the ratio of Tis 3 Sigma 521, and the ratio of Registration 3 Sigma 521 are all input, a total weight value may be displayed. As the user clicks a weighted value application button 530, the processor 314 may generate data comprising information on the input parameters and unique information of the measurement device.

In one embodiment, the processor 314 may identify whether a recipe input ends (S416). The processor 314 may identify whether a ratio of each of the Final Residual 3 Sigma, Tis 3 Sigma, and Registration 3 Sigma is all input.

Additionally, the processor 314 may identify whether unique information on at least one measurement device, to which a recipe input in relation to a plurality of parameters is applied, is input. For example, the unique information may comprise the IP address of the measurement deice, the identifier of the measurement device, a password and the IP address of a server.

Further, the processor 314 may identify whether to input information indicating whether to perform optimization of measurement options of a wafer for each measurement device.

In one embodiment, the processor 314 may generate data comprising information on the input recipe, and predetermined information on at least one measurement device (S418). The processor 314 may respectively generate data comprising information on a recipe for each measurement device, and unique information on the measurement device.

Further, the processor 314 may generate data comprising information indicating whether to perform the optimization of measurement options of a wafer for each measurement device.

In one embodiment, the processor 314 may transmit the generated data to at least one measurement device (S420). The processor 314 may transmit the generated data to a measurement device corresponding to the unique information through the transmission and receipt part 311. For example, the processor 314 may transmit data or signals to one measurement device, or transmit data or signals to each of the plurality of measurement devices at the same time.

The processor 314, as described above, may generate a plurality of data comprising the unique information of each of the plurality of measurement devices, respectively, and may transmit each of the plurality of generated data to a corresponding measurement device through the transmission and receipt part 311, at the same time.

Figure 6:
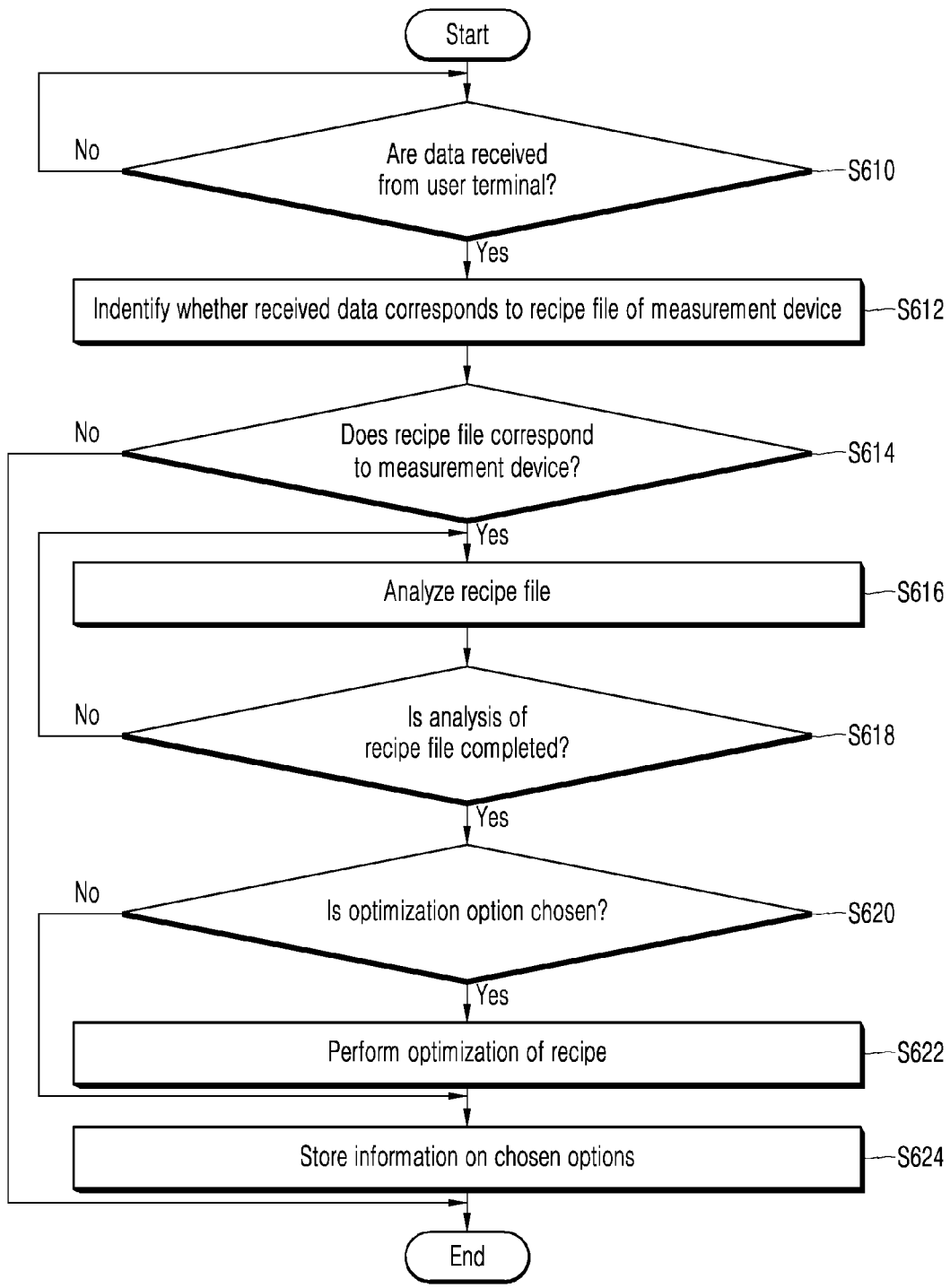
FIG. 6 is a flowchart showing a process in which the measurement device in one embodiment performs optimization, based on a recipe file.
Figure 7:
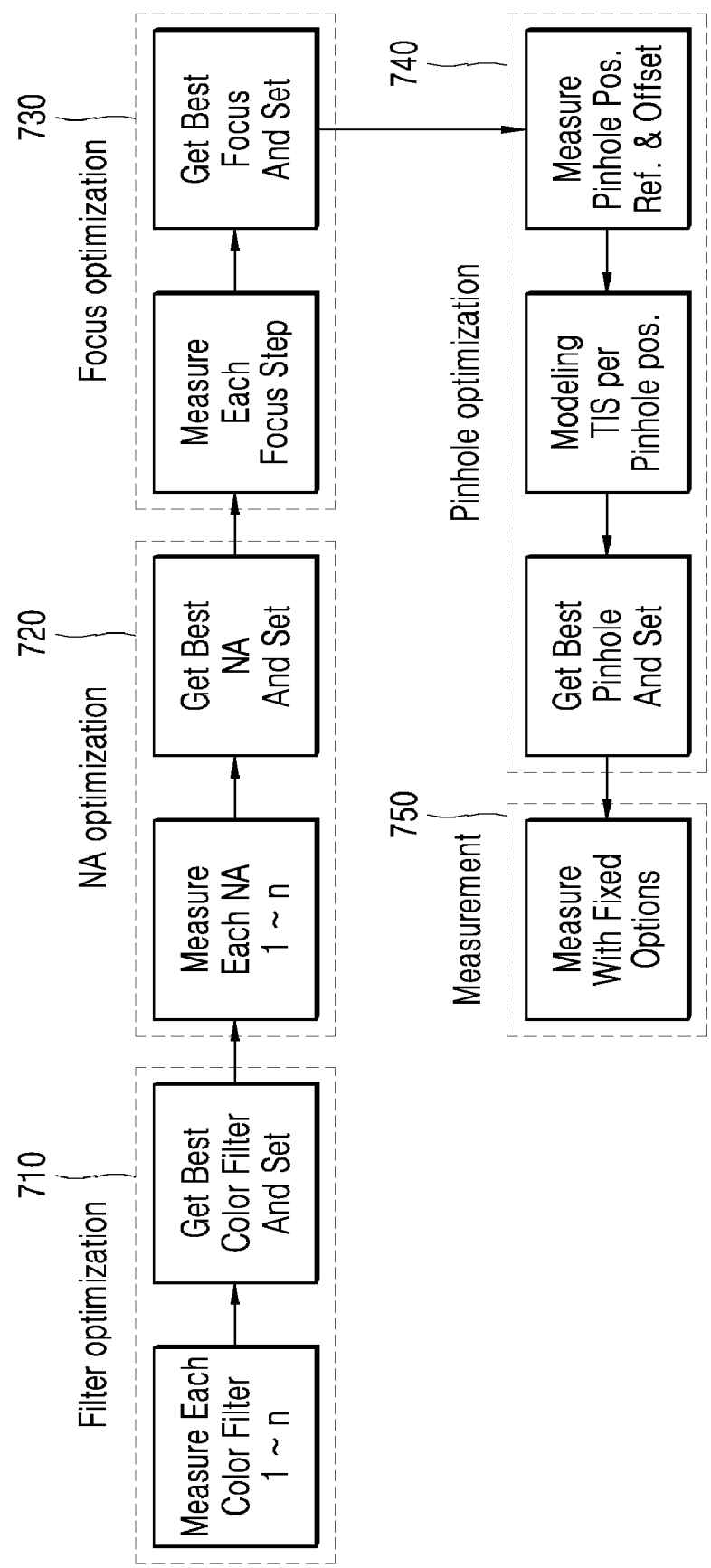
FIG. 7 is an exemplary view showing a state in which the measurement device in one embodiment performs optimization, based on a recipe file.

FIG. 6 is a flowchart showing a process in which the measurement device in one embodiment performs optimization, based on a recipe file. FIG. 7 is an exemplary view showing a state in which the measurement device in one embodiment performs optimization, based on a recipe file.

Hereafter, the process in which the measurement device in one embodiment performs optimization, based on a recipe file, is described with reference to FIGS. 3, 6 and 7.

In one embodiment, the measurement device 120 (e.g., a processor 270) may identify whether data are received from the user terminal 110 (S610). In the state where measurement software is being executed, the measurement device 120 (e.g., a processor 270) continues to check a path in which a recipe file is received from the user terminal 110, by using a thread, to identify whether data are received from the user terminal 110.

For example, the data may comprise information on a recipe that is input by the user through a manager program and unique information on a measurement device. Additionally, the data may comprise information indicating whether to perform optimization of measurement options of a wafer.

In one embodiment, the measurement device 120 (e.g., a processor 270) may identify whether the received data correspond to the recipe file of the measurement device (S612). If the recipe file is received through the transmission and receipt part 321, the measurement device 120 (e.g., a processor 270) may determine whether the recipe file is the recipe file on the measurement device, by using at least one of the name form of the recipe file and the file extension. For example, the name form may be 0000@@0000, and the extension may be xml. In the present disclosure, the name form or the extension is not limited to a specific one.

In one embodiment, the measurement device 120 (e.g., a processor 270) may analyze the recipe file, in the case where the recipe file corresponds to the measurement device (S614 and S616). The measurement device 120 (e.g., a processor 270) reads the received recipe file line by line to compose recipe information.

For example, the measurement device 120 (e.g., a processor 270) may analyze the recipe included in the data that are received from the user terminal 110. For example, the measurement device 120 (e.g., a processor 270) may analyze a value in relation to a plurality of parameters for measuring the characteristics of a wafer 240. For example, the plurality of parameters may comprise a ratio of Final Residual 3 Sigma, a ratio of Tis 3 Sigma, and a ratio of Registration 3 Sigma, a ratio of TMU, a ratio of MAM Time, and a ratio of total weight.

In one embodiment, the measurement device 120 (e.g., a processor 270) may identify whether the analysis of the recipe file is completed (S618). The measurement device 120 (e.g., a processor 270) may read the last line of the recipe file, and as the composition of the recipe file is completed, may store the recipe in the memory 323.

In one embodiment, the measurement device 120 (e.g., a processor 270) may identify whether an optimization option is chosen (S620). The measurement device 120 (e.g., a processor 270) may identify whether information indicating the optimization option is included in the data that are received in the above step (S610). The information on the optimization option may be input by the user through the manager application of the user terminal 110.

In one embodiment, the measurement device 120 (e.g., a processor 270) may perform optimization of a recipe (S622). The measurement device 120 (e.g., a processor 270) may measure one or more filters (e.g., spectrum filters) in the measurement device 120 once, to calculate statistical values in relation to a plurality of parameters for each filter. Alternatively, the processor 270 may apply a weighted value respectively to the calculated statistical values, and perform a filter optimization process of choosing a filter where a total of the statistical values to which the weighted value is applied respectively is a minimum.

Further, the measurement device 120 (e.g., a processor 270) may measure an overlay measurement value, i.e., Tis 3 Sigma and Registration 3 Sigma, in relation to each filter, and model the measured Tis 3 Sigma and Registration 3 Sigma, to obtain Final Residual 3 Sigma.

Further, the measurement device 120 (e.g., a processor 270) may apply weigh respectively to the statistical value of each parameter of each filter, and choose a filter where a total of resultant values to which the weighted value is applied is a minimum.

Referring to FIG. 7, the measurement device 120 (e.g., a processor 270) may calculate statistical values in relation to a plurality of parameters of each of the spectrum filters (1-$n$), apply a weighted value respectively to the calculated statistical values, and perform a filter optimization process 710 of choosing a filter where a total of the statistical values to which the weighted value is applied respectively is a minimum.

In one embodiment, after the filter optimization process is performed, the measurement device 120 (e.g., a processor 270) measures one or more apertures in the measurement device 120 once to calculate statistical values in relation to a plurality of parameters for each aperture. Further, the measurement device 120 (e.g., a processor 270) may apply weigh respectively to the calculated statistical values, and perform an aperture optimization process of choosing an aperture where a total of the statistical values to which the weighted value is applied respectively is a minimum. An aperture may use a single identical lens, and the number of the openings of the aperture may change. Accordingly, the aperture may change the amount and shape of light.

Further, the measurement device 120 (e.g., a processor 270) may measure an overlay measurement value, i.e., Tis 3 Sigma and Registration 3 Sigma, in relation to each aperture, and model the measured Tis 3 Sigma and Registration 3 Sigma to obtain final Residual 3 Sigma.

Further, the measurement device 120 (e.g., a processor 270) may apply weigh respectively to the statistical value of each parameter of each aperture, and choose an aperture where a total of resultant values to which the weighted value is applied is a minimum.

Referring to FIG. 7, the measurement device 120 (e.g., a processor 270) may calculate statistical values in relation to a plurality of parameters of each of the apertures (1-$n$), apply a weighted value respectively to the calculated statistical values, and perform an aperture optimization process 720 of choosing an aperture where a total of the statistical values to which the weighted value is applied respectively is a minimum.

In one embodiment, after the aperture optimization process is performed, the measurement device 120 (e.g., a processor 270) may perform a focus scan on one site in the measurement device 120 to determine a focus measurement area, and move a focus step by step in the determined measurement area on each site to calculate statistical values in relation to the plurality of parameters. Additionally, the measurement device 120 (e.g., a processor 270) may respectively apply a weighted value to the calculated statistical values, and perform a focus optimization process of choosing a focus where a total of the statistical values to which the weighted value is applied respectively is a minimum.

For example, the measurement device 120 (e.g., a processor 270) may measure an overlay measurement value, i.e., Tis 3 Sigma and Registration 3 Sigma, in relation to each focus, and model the measured Tis 3 Sigma and Registration 3 Sigma to obtain Final Residual 3 Sigma.

Further, the measurement device 120 (e.g., a processor 270) may respectively apply a weighted value to the statistical value of each parameter of each focus, and choose a focus where a total of resultant values to which the weighted value is applied is a minimum.

Referring to FIG. 7, the measurement device 120 (e.g., a processor 270) may measure Tis 3 Sigma and Registration 3 Sigma, in relation to each focus, model the measured Tis 3 Sigma and Registration 3 Sigma, and perform a focus optimization process 730 of obtaining Final Residual 3 Sigma.

In one embodiment, after the focus optimization process is performed, the measurement device 120 (e.g., a processor 270) may measure an aperture once in a first pinhole position in relation to the aperture in the measurement device 120, and measure the aperture once in a second pinhole position that is at a predetermined distance (e.g., 3 μm) from the first pinhole position. Additionally, the measurement device 120 (e.g., a processor 270) may calculate Tis 3 Sigma in the first pinhole position and the second pinhole position, and model the Tis 3 Sigma in each pinhole position in relation to the aperture. Further, the measurement device 120 (e.g., a processor 270) may perform a pinhole optimization process of choosing a pinhole position where the Tis 3 Sigma is a minimum.

Referring to FIG. 7, the measurement device 120 (e.g., a processor 270) may calculate Tis 3 Sigma in the first pinhole position and the second pinhole position, model the Tis 3 Sigma in each pinhole position in relation to the aperture, and perform a pinhole optimization process 740 of choosing a pinhole position where the Tis 3 Sigma is a minimum.

In one embodiment, the measurement device 120 (e.g., the processor 270) may store information on chosen options (S624). After the pinhole optimization process is performed, the measurement device 120 (e.g., a processor 270) may store information (e.g., a resultant value of optimization) on options chosen in each of the filter optimization process, the aperture optimization process, the focus optimization process and the pinhole optimization process, in the memory 323.

Referring to FIG. 7, the measurement device 120 (e.g., a processor 270) may store the information (e.g., a resultant value of optimization) on options chosen in each of the above-described filter optimization process, aperture optimization process, focus optimization process and pinhole optimization process, in the memory 323. Additionally, the measurement device 120 (e.g., a processor 270) may control the measuring part 324, and based on the chosen options, measure the characteristics of a wafer 240.

Each of the above-described steps in the flowcharts may be performed regardless of the order illustrated, or performed at the same time. Further, in the present disclosure, at least one of the components, and at least one operation performed by at least one of the components can be embodied as hardware and/or software.

The embodiments are described above with reference to a number of illustrative embodiments thereof. However, embodiments are not limited to the embodiments and drawings set forth herein, and numerous other modifications and embodiments can be drawn by one skilled in the art within the technical scope of the disclosure. Further, the effects and predictable effects based on the configurations in the disclosure are to be included within the range of the disclosure though not explicitly described in the description of the embodiments.

| Description of Reference Numerals | |
|---|---|
| 100: Overlay measurement system | 110: User terminal |
| 120: Overlay measurement device | 270: Processor |
| 321: Transmission and receipt part | 322: Display part |
| 323: Memory | 324: Measurement part |

The invention claimed is:

1. An overlay measurement device for measuring an error between a first overlay mark and a second overlay mark respectively formed on different layers of a wafer, the overlay measurement device comprising:
   a light source;
   an objective lens that concentrates a beam from the light source on a measurement position of the wafer, and gathers the beam being reflected in the measurement positon;
   a lens focus actuator that adjusts a distance between the objective lens and the wafer such that a focus surface is placed at the first overlay mark or the second overlay mark;
   an auto focus module that adjusts a focus by adjusting the lens focus actuator;
   a detector for obtaining an image of the first overlay mark or an image of the second overlay mark;
   a transmission and receipt part; and
   a processor connecting to the transmission and receipt part electrically,
   wherein the processor is configured to:
   obtain data transmitted from a user terminal through the transmission and receipt part,
   analyze a recipe included in the data,
   perform optimization of measurement options of a wafer, based on the recipe, after the recipe is analyzed,
   perform a focus scan at one site by controlling the auto focus module,
   determine a focus measurement area based on the performed focus scan,
   calculate statistical values for a plurality of parameters by moving the focus by one step within the determined focus measurement area for each site,
   apply a weight respectively to the calculated statistical values, and
   perform a focus optimization process of selecting a focus where a total of the statistical values to which the weight is applied respectively is a minimum value as a focus of the auto focus module.

2. The overlay measurement device of claim 1, wherein the data comprises information indicating whether to perform the optimization of measurement options of a wafer.

3. The overlay measurement device of claim 1, wherein the data comprises information on a recipe that is input to measure characteristic of a wafer through a manager program installed in the user terminal and unique information on the overlay measurement device.

4. The overlay measurement device of claim 3, wherein the unique information comprises an internet protocol (IP) address, an identifier, and a password of the overlay measurement device, and an IP of a server.

5. The overlay measurement device of claim 1, wherein the processor determines authenticity of a file of the recipe by using at least one of a name form and a file extension of the file of the recipe included in the data.

6. The overlay measurement device of claim 1, wherein the plurality of parameters comprises at least one of Final Residual 3 Sigma, Tis 3 Sigma, Registration 3 Sigma, total measurement uncertainty (TMU), and move and measure (MAM) time, or comprises total weight comprised of combinations thereof.

7. The overlay measurement device of claim 1, wherein the processor stores information on options that are chosen a focus optimization process, in a memory.

8. An overlay measurement system, comprising:
a user terminal generating data that comprise information on a recipe which is input through a manager program, and unique information on an overlay measurement device, and transmitting the generated data to an overlay measurement device corresponding to the unique information, and
the overlay measurement device analyzing a recipe included in the data that are received from the user terminal, and performing optimization of measurement options of a wafer, based on the recipe, after the recipe is analyzed,
wherein the overlay measurement device measures an error between a first overlay mark and a second overlay mark respectively formed on different layers of a wafer,
wherein the overlay measurement device comprises a light source, an objective lens that concentrates a beam from the light source on a measurement position of the wafer and gathers the beam being reflected in the measurement positon, a lens focus actuator that adjusts a distance between the objective lens and the wafer such that a focus surface is placed at the first overlay mark or the second overlay mark, an auto focus module that adjusts a focus by adjusting the lens focus actuator, and a detector for obtaining an image of the first overlay mark or an image of the second overlay mark,
wherein the overlay measurement device is configured to:
perform a focus scan at one site by controlling the auto focus module,
determine a focus measurement area based on the performed focus scan,
calculate statistical values for a plurality of parameters by moving the focus by one step within the determined focus measurement area for each site,
apply a weight respectively to the calculated statistical values, and
perform a focus optimization process of selecting a focus where a total of the statistical values to which the weight is applied respectively is a minimum value as a focus of the auto focus module.

9. A method of an overlay measurement device for measuring an error between a first overlay mark and a second overlay mark respectively formed on different layers of a wafer, the method comprising:
receiving data from a user terminal, the data comprising information indicating whether to execute the optimization of measurement options of a wafer;
analyzing a recipe that is included in the data; and
when analyzing the recipe is completed and the data includes information indicating an execution of the optimization, performing optimization of measurement options of a wafer, based on the recipe,
wherein the overlay measurement device comprises a light source, an objective lens that concentrates a beam from the light source on a measurement position of the wafer and gathers the beam being reflected in the measurement positon, a lens focus actuator that adjusts a distance between the objective lens and the wafer such that a focus surface is placed at the first overlay mark or the second overlay mark, an auto focus module that adjusts a focus by adjusting the lens focus actuator, and a detector for obtaining an image of the first overlay mark or an image of the second overlay mark, and
wherein the optimization comprises:
performing a focus scan at one site by controlling the auto focus module,
determining a focus measurement area based on the performed focus scan,
calculating statistical values for a plurality of parameters by moving the focus by one step within the determined focus measurement area for each site,
applying a weight respectively to the calculated statistical values, and
performing a focus optimization process of selecting a focus where a total of the statistical values to which the weight is applied respectively is a minimum value as a focus of the auto focus module.

10. The method of claim 9, wherein receiving data comprises determining authenticity of a file of the recipe by using at least one of a name form and a file extension of the file of the recipe included in the data.

11. The method of claim 9, wherein the plurality of parameters comprises at least one of Final Residual 3 Sigma, Tis 3 Sigma, Registration 3 Sigma, total measurement uncertainty (TMU), and move and measure (MAM) time, or comprises total weight comprised of combinations thereof.

* * * * *